United States Patent
Yang

(10) Patent No.: US 10,141,392 B2
(45) Date of Patent: *Nov. 27, 2018

(54) MICROSTRUCTURE MODULATION FOR 3D BONDED SEMICONDUCTOR STRUCTURE WITH AN EMBEDDED CAPACITOR

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,857

(22) Filed: Feb. 23, 2017

(65) Prior Publication Data

US 2018/0240860 A1 Aug. 23, 2018

(51) Int. Cl.
*H01L 21/02* (2006.01)
*H01L 49/02* (2006.01)
(Continued)

(52) U.S. Cl.
CPC ........ *H01L 28/40* (2013.01); *H01L 21/30625* (2013.01); *H01L 21/324* (2013.01); *H01L 23/5226* (2013.01); *H01L 23/53214* (2013.01); *H01L 23/53219* (2013.01); *H01L 23/53228* (2013.01); *H01L 23/53233* (2013.01); *H01L 23/53257* (2013.01); *H01L 23/53261* (2013.01); *H01L 24/83* (2013.01); *H01L 25/0657* (2013.01); *H01L 2225/06541* (2013.01)

(58) Field of Classification Search
None
See application file for complete search history.

(56) References Cited

U.S. PATENT DOCUMENTS 5,930,669 A   7/1999   Uzoh
6,291,343 B1  9/2001   Tseng et al.
(Continued)

FOREIGN PATENT DOCUMENTS

EP   1275142       1/2003
WO   0161743 A1   8/2001

OTHER PUBLICATIONS

C. Ventosa et al., "Mechanism of thermal silicon oxide direct wafer bonding", Electrochemical and Solid-State Letters, Aug. 2009, pp. H373-H375, vol. 12, No. 10.
(Continued)

*Primary Examiner* — Calvin Choi
(74) *Attorney, Agent, or Firm* — Scully, Scott, Murphy & Presser, P.C.; Steven J. Meyers

(57) ABSTRACT

A three-dimensional (3D) bonded semiconductor structure is provided in which a first bonding oxide layer of a first semiconductor structure is bonded to a second bonding oxide layer of a second semiconductor structure. Each of the first and second bonding oxide layers has a metallic capacitor plate structure embedded therein, wherein each metallic capacitor plate structure has a columnar grain microstructure. A high-k dielectric material is present between the first and second metallic capacitor plate structures. The presence of the columnar grain microstructure in the metallic capacitor plate structures can provide an embedded capacitor that has an improved quality factor, Q.

20 Claims, 8 Drawing Sheets

(51) Int. Cl.
*H01L 25/065* (2006.01)
*H01L 23/522* (2006.01)
*H01L 23/532* (2006.01)
*H01L 21/324* (2006.01)
*H01L 21/306* (2006.01)
*H01L 23/00* (2006.01)

(56) References Cited

U.S. PATENT DOCUMENTS

| | | |
|---|---|---|
| 6,902,987 B1 | 6/2005 | Tong et al. |
| 7,872,332 B2 | 1/2011 | Fay et al. |
| 7,968,915 B2 | 6/2011 | Kanarsky et al. |
| 8,426,256 B2 | 4/2013 | Hsiao et al. |
| 9,620,479 B1 * | 4/2017 | Edelstein ............ H01L 24/83 |
| 2011/0193240 A1 | 8/2011 | Farooq et al. |
| 2014/0217593 A1 | 8/2014 | Chen et al. |
| 2017/0092680 A1 | 3/2017 | Kwon |

OTHER PUBLICATIONS

M. Eichler et al., "Effects on silanol condensation during low temperature silicon fusion bonding", Journal of the Electrochem. Soc., Aug. 2009, pp. H786-H793, vol. 156, No. 10.

C. Chen et al., "Low-temperature and low-pressure direct copper-to-copper bonding by highly (111)-oriented nanotwinned Cu", Pan Pacific Microelectronics Symposium (Pan Pacific), Jan. 2016, 5 pages.

C. S. Tan et al., "Low Temperature Wafer Bonding of Low-K Carbon-Doped Oxide for Application in 3D Integration", Electrochemical and Solid-State Letters, Nov. 2009, pp. H27-H29, vol. 13, No. 2.

B. Rebhan et al., "Physical mechanisms of copper-copper wafer bonding", Journal of Applied Physics, Oct. 2015, 135301, 10 pages, vol. 118, No. 13.

K. Warner et al., "Low-temperature oxide-bonded three-dimensional integrated circuits", IEEE International SOI Conference, Oct. 2002, pp. 123-124.

List of IBM Patents or Patent Applications Treated as Related dated Feb. 23, 2017, 2 pages.

Office Action dated Oct. 6, 2017 received in U.S. Appl. No. 15/440,807.

Office Action dated May 11, 2018 received in U.S. Appl. No. 15/440,807.

* cited by examiner

US 10,141,392 B2

MICROSTRUCTURE MODULATION FOR 3D BONDED SEMICONDUCTOR STRUCTURE WITH AN EMBEDDED CAPACITOR

BACKGROUND

The present application relates to a semiconductor structure and a method of forming the same. More particularly, the present application relates to a three-dimensional (3D) bonded semiconductor structure having an embedded capacitor that has a low resistivity and thus exhibits an improved quality factor, Q. The present application also relates to a method of forming such a 3D bonded semiconductor structure.

Three-dimensional (3D) integration is critical in current and in future technology development. Traditionally, oxide-oxide bonding is performed to physically connect two wafers and, thereafter, through-silicon-vias (TSVs) are formed to electrically connect the two wafers.

In the most advanced 3D integration technology development, oxide-oxide and metal to metal (e.g., Cu—Cu) bonding are performed simultaneously. Accordingly, both oxide/oxide bonding strength and metal/metal contact are critical in order to meet the mechanical integrity requirement as well as the electrical performance.

The quality factor, Q, of a capacitor represents the efficiency of a given capacitor in terms of energy losses. The quality factor, Q, decreases with increasing electrical resistance of this device element. Presently, capacitors that are embedded in a 3D semiconductor structure have high resistivity. As such, there is a need for providing a 3D semiconductor structure having an embedded capacitor that has low resistivity and thus, an improved quality factor, Q.

SUMMARY

A three-dimensional (3D) bonded semiconductor structure is provided in which a first bonding oxide layer of a first semiconductor structure is bonded to a second bonding oxide layer of a second semiconductor structure. Each of the first and second bonding oxide layers has a metallic capacitor plate structure embedded therein, wherein each metallic capacitor plate structure has a columnar grain microstructure. A high-k dielectric material is present between the first and second metallic capacitor plate structures. The presence of the columnar grain microstructure in the metallic capacitor plate structures can provide an embedded capacitor that has an improved quality factor, Q. In some embodiments, the 3B bonded semiconductor structure further includes first and second dummy metallic pad structures that are bonded together. In such an embodiment, at least one columnar grain extends across the bonding interface that is present between the first and second dummy metallic pad structures.

In one aspect of the present application, a three-dimensional (3D) bonded semiconductor structure is provided. In one embodiment, the three dimensional (3D) bonded semiconductor structure may include a first semiconductor structure including a first semiconductor wafer, a first interconnect structure, a first bonding oxide layer, and a first metallic capacitor plate structure having a columnar grain microstructure embedded in the first bonding oxide layer. The 3D bonded semiconductor may also include a second semiconductor structure including a second semiconductor wafer, a second interconnect structure, a second bonding oxide layer, and a second metallic capacitor plate structure having a columnar grain microstructure embedded in the second bonding oxide layer. In accordance with the present application, a high-k dielectric material is present between the first metallic capacitor plate structure and the second metallic capacitor plate structure. A bonding interface is present between the first and second bonding oxide layers and another bonding interface is present between the high-k dielectric material and the first metallic capacitor plate structure or the second metallic capacitor plate structure. In some embodiments, a bonding interface may also formed between a first dummy metallic pad structure embedded in the first bonding oxide layer and a second dummy metallic pad structure embedded in the second bonding oxide layer. Furthermore, and in such an embodiment, the first and second dummy metallic pad structures also have a columnar grain microstructure. In such an embodiment, at least one columnar grain extends across the bonding interface that is present between the first and second dummy metallic pad structures.

Another aspect of the present application relates to a method of forming a three-dimensional (3D) bonded semiconductor structure containing an embedded capacitor. In one embodiment, the method may include providing a first semiconductor structure comprising a first semiconductor wafer, a first interconnect structure, a first bonding oxide layer, and a first metallic capacitor plate structure having a columnar grain microstructure embedded in the first bonding oxide layer, and a second semiconductor structure comprising a second semiconductor wafer, a second interconnect structure, a second bonding oxide layer, and a second metallic capacitor plate structure having a columnar grain microstructure embedded in the second bonding oxide layer. Next, a high-k dielectric material is formed on a surface of the first metallic capacitor plate structure or the second metallic capacitor plate structure, and thereafter the first semiconductor structure is bonded to the second semiconductor structure. Bonding provides a bonding interface between the first and second bonding oxide layers and another bonding interface between the high-k dielectric material and the first metallic capacitor plate structure or the second metallic capacitor plate structure. In some embodiments, a bonding interface may also formed between a first dummy metallic pad structure embedded in the first bonding oxide layer and a second dummy metallic pad structure embedded in the second bonding oxide layer. In such an embodiment, the first and second dummy metallic pad structures also have a columnar grain microstructure. Furthermore, and in such an embodiment, at least one columnar grain extends across the bonding interface that is present between the first and second dummy metallic pad structures. Grain growth occurs during the bonding of the two structures together.

DETAILED DESCRIPTION

Figure 1A:
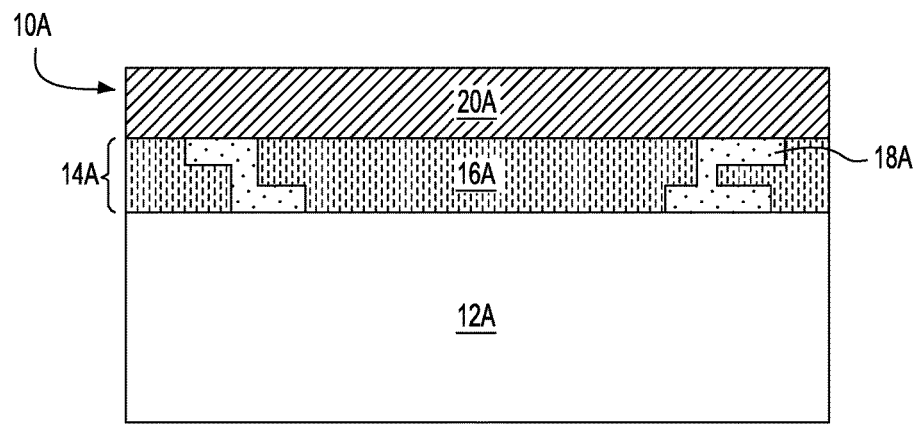
FIG. 1A is a cross sectional view of a first semiconductor structure including a first semiconductor wafer, a first interconnect structure, and a first bonding oxide layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
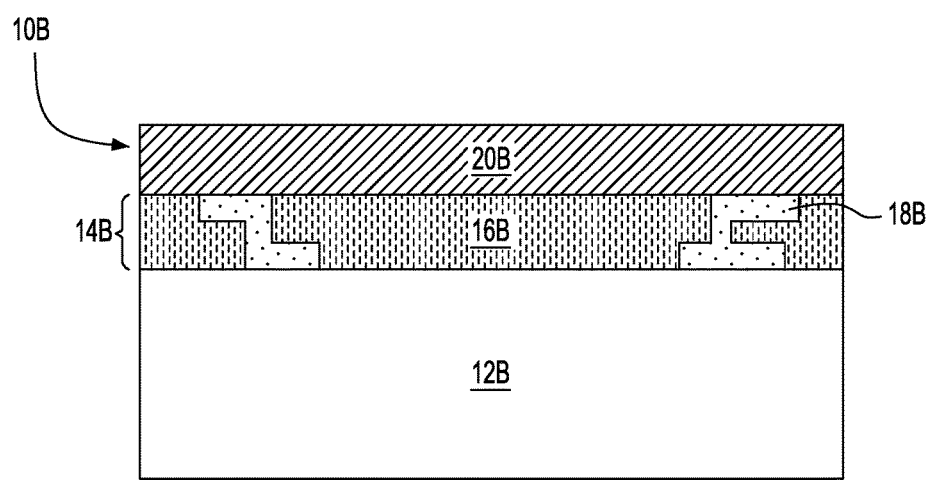
FIG. 1B is a cross sectional view of a second semiconductor structure including a second semiconductor wafer, a second interconnect structure, and a second bonding oxide layer.

Referring first to FIGS. 1A and 1B, there are shown a first semiconductor structure 10A and a second semiconductor structure 10B, respectively, that can be employed in the present application. In the present application and following subsequent processing steps, the first and second exemplary structures (10A, 10B) will be bonded to each other. Throughout the present application, the first and second semiconductor structures can be formed and/or processed in any order. In some embodiments, the first and second semiconductor structures can be formed and/or processed simultaneously.

The first semiconductor structure 10A shown in FIG. 1A includes a first semiconductor wafer 12A, a first interconnect structure 14A, and a first bonding oxide layer 20A. The first interconnect structure 14A includes at least one interconnect dielectric material 16A including one or more interconnect metallic structures 18A embedded therein. The second semiconductor structure 10B shown in FIG. 1B includes a second semiconductor wafer 12B, a second interconnect structure 14B, and a second bonding oxide layer 20B. The second interconnect structure 14B includes at least one interconnect dielectric material 16B including one or more interconnect metallic structures 18B embedded therein.

The first semiconductor wafer 12A and the second semiconductor wafer 12B both include a semiconductor substrate (not separately shown) having one or more semiconductor devices (also not separately shown) formed thereon. The semiconductor substrate that can be used as a component of the first and second semiconductor wafers (12A, 12B) may include a semiconductor material that has semiconducting properties. The semiconductor material that can provide the semiconductor substrate of the first and second semiconductor wafers (12A, 12B) may include, but is not limited to, silicon (Si), germanium (Ge), silicon germanium alloys (SiGe), silicon carbide (SiC), III-V compound semiconductors, II-VI compound semiconductors or multilayered combinations thereof. In some embodiments, the semiconductor material that provides the semiconductor substrate of the first semiconductor wafer 12A may be the same as a semiconductor material that provides the semiconductor substrate of the second semiconductor wafer 12B. In yet other embodiments, the semiconductor material that provides the semiconductor substrate of the first semiconductor wafer 12A may be different from the semiconductor material that provides the semiconductor substrate of the second semiconductor wafer 12B.

In some embodiments, the semiconductor substrate of the first and second semiconductor wafers (12A, 12B) may be a bulk crystalline substrate. The term "bulk" denotes the entirety of the crystalline substrate is composed of at least one crystalline material with no insulators and/or conductive materials present therein.

In yet other embodiments, the semiconductor substrate of the first and second semiconductor wafers (12A, 12B) may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

The one or more semiconductor devices that can be present on the semiconductor substrate of the first and second semiconductor wafers (12A, 12B) may include, for example, transistors, capacitors, diodes, and/or resistors. The one or more semiconductor devices can be formed utilizing techniques that are well known in the semiconductor industry. For example, transistors may be formed utilizing a gate-first process or a gate-last process (also referred as to a replacement gate process). So as not to obscure the processing steps of the present application, the techniques used in forming the one or more semiconductor devices are not described herein in detail.

As mentioned above, the first semiconductor structure 10A includes a first interconnect structure 14A that contains at least one interconnect dielectric material 16A including one or more interconnect metallic structures 18A embedded therein, while the second semiconductor structure 10B includes a second interconnect structure 14B that includes at least one interconnect dielectric material 16B including one or more interconnect metallic structures 18B embedded therein.

The at least one interconnect dielectric material (16A, 16B) of the first and second interconnect structures (14A, 14B) may include any interlevel or intralevel dielectric including inorganic dielectrics or organic dielectrics. In one embodiment, the least one interconnect dielectric material (16A, 16B) of the first and second interconnect structures (14A, 14B) may be non-porous. In another embodiment, the least one interconnect dielectric material (16A, 16B) of the first and second interconnect structures (14A, 14B) may be porous. Some examples of suitable dielectrics that can be used as the least one interconnect dielectric material (16A, 16B) of the first and second interconnect structures (14A, 14B) include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments, the dielectric material of the at least one interconnect dielectric material 16A of the first interconnect structure 14A is the same as the dielectric material of the at least one interconnect dielectric material 16B of the second interconnect structure 14B. In other embodiments of the present application, the dielectric material of the at least one interconnect dielectric material 16A of the first interconnect structure 14A is different from the dielectric material of the at least one interconnect dielectric material 16B of the second interconnect structure 14B.

The at least one interconnect dielectric material (16A, 16B) of the first and second interconnect structures (14A, 14B) typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the at least one interconnect dielectric material (16A, 16B) of the first and second interconnect structures (14A, 14B) may vary depending upon the type of dielectric material(s) used. In one example, the at least one interconnect dielectric material (16A, 16B) of the first and second interconnect structures (14A, 14B) may have a thickness from 50 nm to 1000 nm. Other thicknesses that are lesser than, or greater than, the aforementioned thickness range may also be employed in the present application for the thickness of the at least one interconnect dielectric material (16A, 16B) of the first and second interconnect structures (14A, 14B).

The at least one interconnect dielectric material (16A, 16B) of the first and second interconnect structures (14A, 14B) may be formed utilizing a deposition process such as, for example, chemical vapor deposition (CVD), plasma enhanced chemical vapor deposition (PECVD) or spin-on coating.

As mentioned above, one or more interconnect metallic structures 18A can be embedded in the at least one interconnect dielectric material 16A of the first interconnect structures 14A, and one or more interconnect metallic structures 18B can be embedded in the at least one interconnect dielectric material 16B of the second interconnect structures 14B. By "embedded" it is meant each metallic structure (18A, 18B) is contained within the at least one interconnect dielectric material (16A, 16B). As is shown, the topmost surface of each interconnect metallic structure (18A, 18B) is coplanar with a topmost surface of the at least one interconnect dielectric material (16A, 16B).

The one or more interconnect metallic structures (18A, 18B) are composed of copper (Cu), a copper-aluminum alloy (Cu—Al), a copper manganese alloy (Cu—Mn), aluminum (Al) or an aluminum-copper alloy (Al—Cu). In the present application, the one or more interconnect metallic structures 18A are typically composed of a same interconnect metal (i.e., copper, a copper-aluminum alloy, a copper manganese alloy, aluminum or an aluminum-copper alloy) as the one or more interconnect metallic structures 18B. The one or more interconnect metallic structures (18A, 18B) may or may not have a polycrystalline microstructure.

The one or more interconnect metallic structures (18A, 18B) can be formed by first providing at least one opening into the at least one interconnect dielectric material (16A, 16B) and then filling the at least one opening with an interconnect metal or metal alloy as defined above.

The at least one opening can be formed utilizing a patterning process. In one embodiment, the patterning process may include lithography and etching. The lithographic process includes forming a photoresist (not shown) atop the at least one interconnect dielectric material (16A, 16B), exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening.

The at least one opening that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. When a via or line is formed, a single damascene process (including the above mentioned lithography and etching steps) can be employed. When a combined via/line is formed a dual damascene process (including at least one iteration of the above mentioned lithography and etching steps) can be employed.

Prior to forming the interconnect metal or metal alloy, a diffusion barrier (not show) can be optionally formed within the at least one opening. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

The interconnect metal or metal alloy is then formed into each opening utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the interconnect metal or metal alloy of each interconnect metallic structure (18A, 18B).

Following the deposition of the interconnect metal or metal alloy, a planarization process such as, for example, chemical mechanical polishing (CMP) and/or grinding, can be used to remove all interconnect metal or metal alloy (i.e., overburden material) that is present outside the at least one opening forming the structures shown in FIGS. 1A and 1B. The planarization stops on a topmost surface of the at least one interconnect dielectric material (16A, 16B) providing the coplanar structures illustrated in FIGS. 1A-1B.

The first semiconductor wafer 12A also includes a first bonding oxide layer 20A present on the first interconnect structure 14A, while the second semiconductor wafer 12B also includes a second bonding oxide layer 20B present on the second interconnect structure 14B.

The first and second bonding oxide layers (20A, 20B) are composed of a same dielectric bonding oxide such as, for example, silicon dioxide, tetraethylorthosilicate (TEOS), or fluorinated tetraethylorthosilicate (FTEOS). The first and second bonding oxide layers (20A, 20B) can be formed by a deposition process such as, for example, chemical vapor deposition (CVD) or plasma enhanced chemical vapor deposition (PECVD). The first and second bonding oxide layers (20A, 20B) can have a thickness from 50 nm to 200 nm; although other thicknesses are not excluded from being used in the present application as the thickness of the first and second bonding oxide layers (20A, 20B).

Figure 2A:
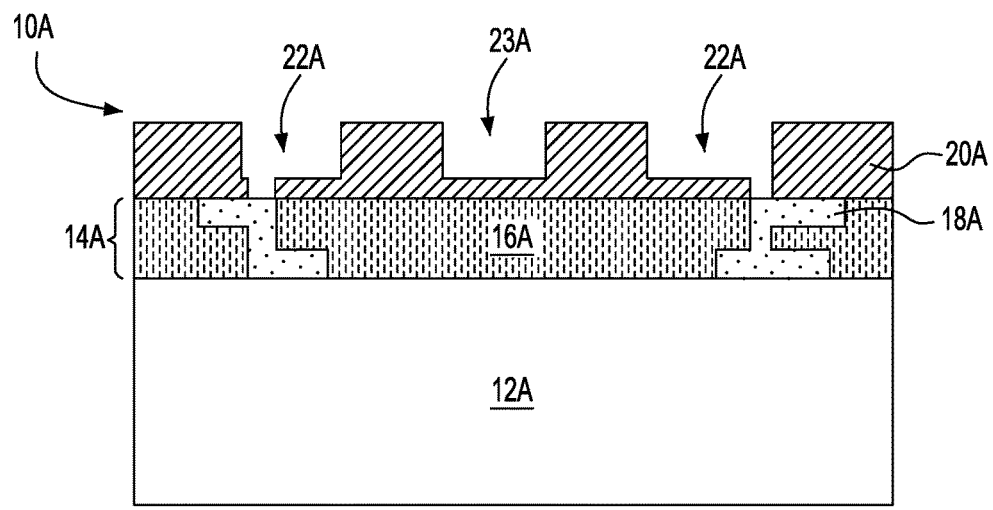
FIG. 2A is a cross sectional view of the first semiconductor structure of FIG. 1A after forming at least one first capacitor plate opening and at least one first dummy pad opening in the first bonding oxide layer.
Figure 2B:
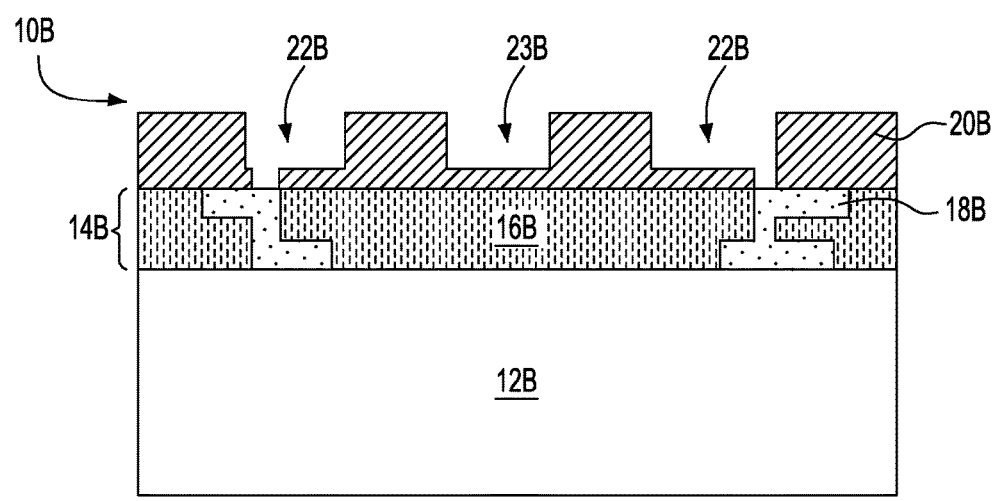
FIG. 2B is a cross sectional view of the second semiconductor structure of FIG. 1B after forming at least one second capacitor plate opening and at least one second dummy pad opening in the second bonding oxide layer.

Referring now to FIG. 2A-2B, there are shown the first semiconductor structure after forming at least one first capacitor plate opening 22A and at least one first dummy pad opening 23A in the first bonding oxide layer 20A, and forming at least one second capacitor plate opening 22B and at least one second dummy pad opening 23B in the second bonding oxide layer 20B, respectively.

The first and second capacitor plate openings (22A, 22B) may be a via opening, a line opening or a combined line/via opening. The first and second capacitor plate openings (22A, 22B) can be formed by lithography and etching as defined above in forming the openings in the at least one interconnect dielectric material (16A, 16B). The at least one first capacitor plate opening 22A exposes at least a portion of the topmost surface of at least one of the interconnect metallic structures 18A present in the at least one interconnect dielectric material 16A, while the at least second capacitor plate opening 22B exposes at least a portion of the topmost surface of at least one of the interconnect metallic structures 18B present in the at least one interconnect dielectric material 16B.

The first and second dummy pad openings (23A, 23B) can be formed utilizing a same or different patterning step as employed in forming the first and second capacitor plate openings (22A, 22B). The first and second dummy pad openings (23A, 23B) may extend completely through the bonding oxide layer so as to physical expose a surface of the underlying interconnect dielectric material, or the first and second dummy pad openings (23A, 23B) can extend partially through an upper portion of the bonding oxide layer. The first and second dummy pad openings (23A, 23B) can be used to enhance the bonding between the two semiconductor structures. In some embodiments, the formation of the first and second dummy pad openings (23A, 23B) may be omitted.

Figure 3A:
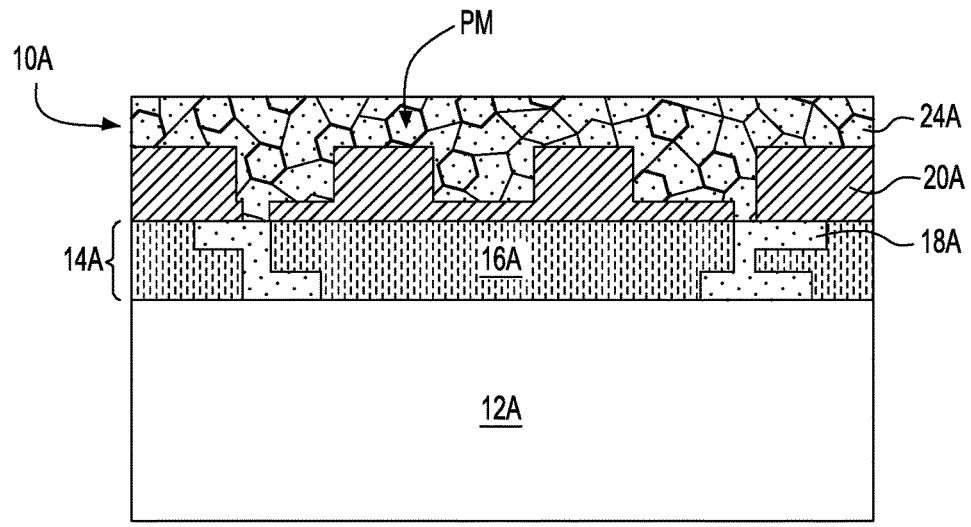
FIG. 3A is a cross sectional view of the first semiconductor structure of FIG. 2A after forming a first metallic layer having a polycrystalline microstructure.
Figure 3B:
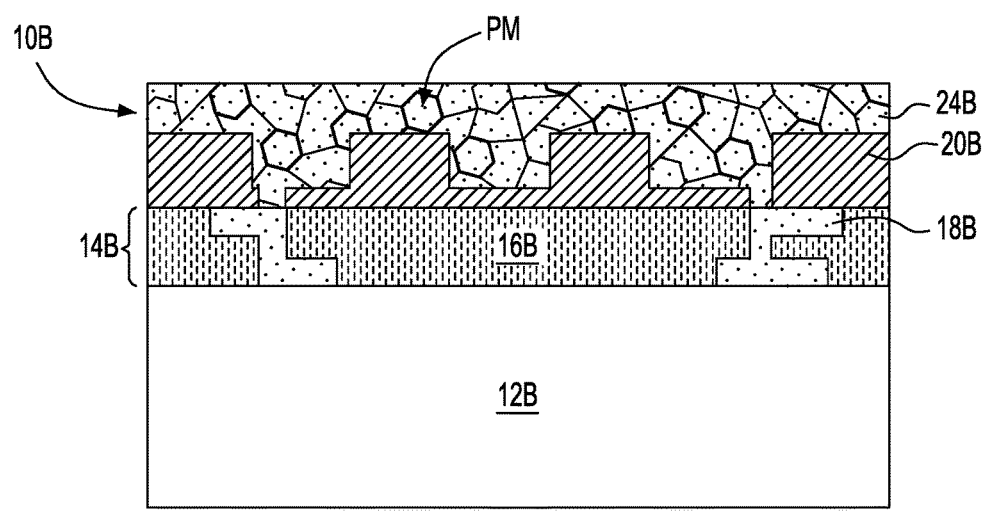
FIG. 3B is a cross sectional view of the second semiconductor structure of FIG. 2B after forming a second metallic layer having a polycrystalline microstructure.

Referring now to FIGS. 3A-3B, there are shown the first semiconductor structure after forming a first metallic layer 24A having a polycrystalline microstructure (PM), and the second semiconductor structure after forming a second metallic layer 24B having a polycrystalline microstructure (PM), respectively. As is shown, each of the metallic layers (24A, 24B) completely fills in the openings (i.e., capacitor plate and dummy pad openings) in the respective bonding oxide layer. Also, each of the metallic layers (24A, 24B) has an upper portion that is present outside the openings (i.e., capacitor plate and dummy pad openings) and above the topmost surface of the respective bonding oxide layer. The term "polycrystalline microstructure" is used throughout the present application to denote a microstructure of a material in which the individual grains are randomly orientated. Applicant has determined that the presence of the polycrystalline microstructure in metallic structures negatively impacts the resistivity of the capacitor structure embedded in a 3-D bonded semiconductor structure.

The first and second metallic layers (24A, 24B) are composed of metal or metal alloy and will subsequently provide the capacitor plates of an embedded capacitor. The metal or metal alloy that provides the first and second metallic layers (24A, 24B) may include tantalum (Ta), tungsten (W), cobalt (Co), rhodium (Rh), ruthenium (Ru), aluminum (Al), copper (Cu) or alloys thereof. In one embodiment, the metal or metal alloy that provides the first metallic layer 24A is the same as a metal or metal alloy that provides the second metallic layer 24B. In another embodiment, the metal or metal alloy that provides the first metallic layer 24A is different from the metal or metal alloy that provides the second metallic layer 24B. The metal or metal alloy that provides the first and second metallic layers (24A, 24B) may be the same as, or different from the metal or metal alloy that provides the at least one interconnect structures (18A, 18B). The first and second metallic layers (24A, 24B) can be formed utilizing one of the deposition processes mentioned above for depositing the interconnect metal or metal alloy.

Figure 4A:
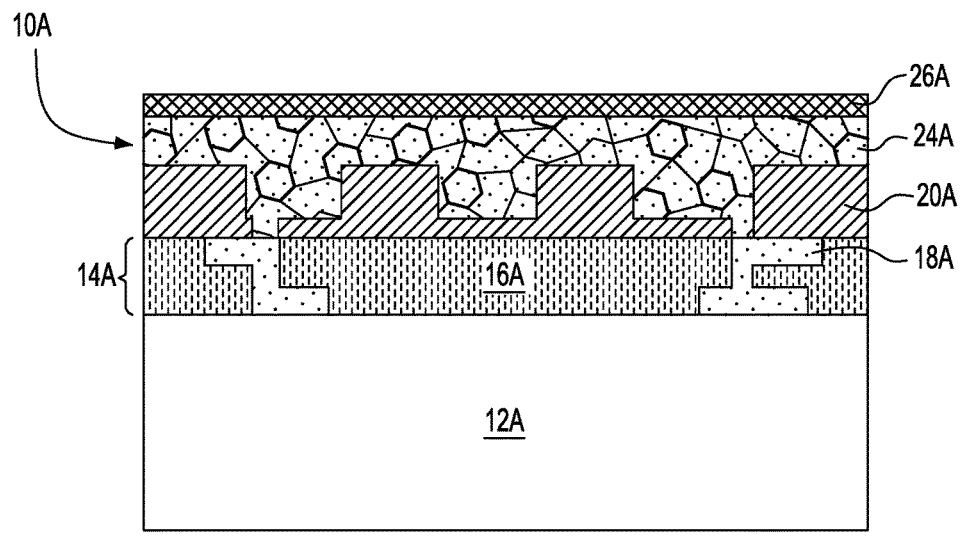
FIG. 4A is a cross sectional view of the first semiconductor structure of FIG. 3A after forming a first stress control layer on a physically exposed surface of the first metallic layer.
Figure 4B:
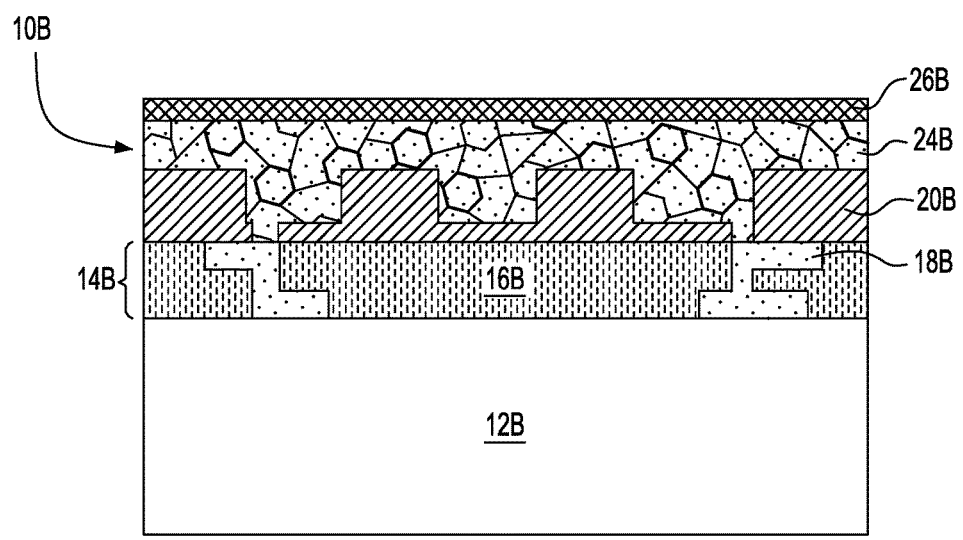
FIG. 4B is a cross sectional view of the second semiconductor structure of FIG. 3B after forming a second stress control layer on a physically exposed surface of the second metallic layer.

Referring now to FIGS. 4A-4B, there are illustrated the first semiconductor structure after forming a first stress control layer 26A on a physically exposed surface of the first metallic layer 24A, and the second semiconductor structure after forming a second stress control layer 26B on a physically exposed surface of the second metallic layer 24B, respectively.

Each of the stress control layers (26A, 26B) is a continuous layer that is formed on the entirety of the respective metallic layer (24A, 24B). Each of the stress control layers (26A, 26B) may include a metal or metal nitride that is compositionally different than the respective metallic layer (24A, 24B). Examples of metals or metal nitrides that may be employed as the stress control layers (26A, 26B) include, tantalum, tantalum nitride, titanium, titanium nitride, cobalt, cobalt nitride, tungsten, tungsten nitride, ruthenium, ruthenium nitride, aluminum or aluminum nitride. In some embodiments, the first and second stress control layers (26A, 26B) include a same metal or metal nitride. In other embodiments, the first stress control layer 26A includes a metal or metal nitride that is different than the metal or metal nitride that is employed as the second stress control layer 26B.

The thickness of the first and second stress control layers (26A, 26B) may vary. In some embodiments, the first and second stress control layers (26A, 26B) may have a thickness from 5 nm to 50 nm; although other thicknesses for the first and second stress control layers (26A, 26B) are contemplated and can be employed in the present application.

The first and second control layers (26A, 26B) can be formed utilizing a deposition process such as, for example, chemical vapor deposition (CVD), plasma enhanced chemical vapor deposition (PECVD), atomic layer deposition (ALD), physical vapor deposition (PVD), sputtering, chemical solution deposition or plating.

Figure 5A:
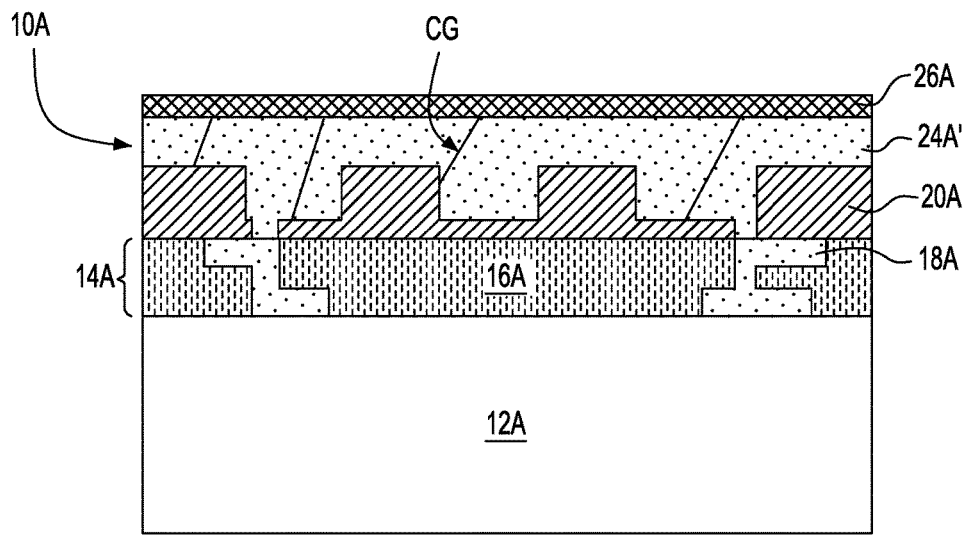
FIG. 5A is a cross sectional view of the first semiconductor structure of FIG. 4A after performing an anneal to convert the polycrystalline microstructure of the first metallic layer into a microstructure having columnar grains.
Figure 5B:
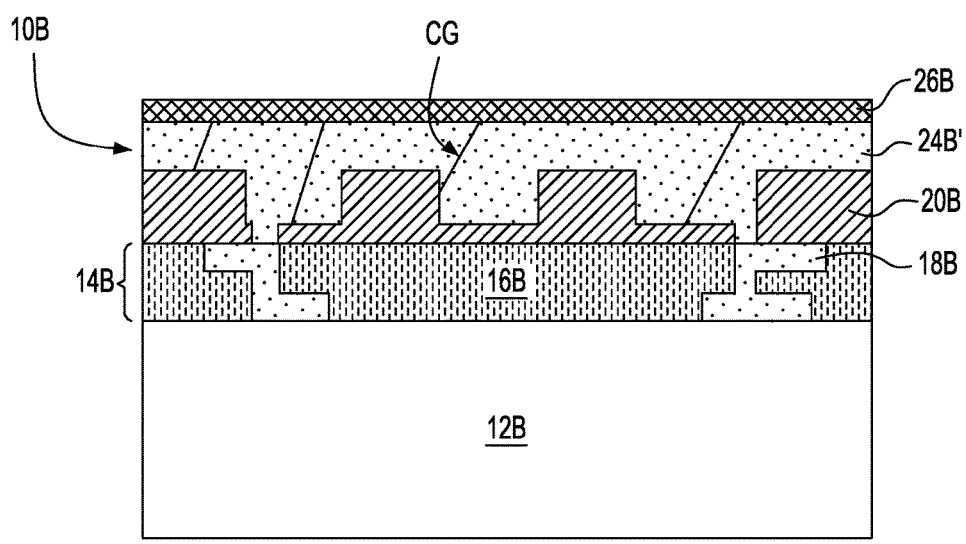
FIG. 5B is a cross sectional view of the second semiconductor structure of FIG. 4B after performing an anneal to convert the polycrystalline microstructure of the second metallic layer into a microstructure having columnar grains.

Referring now to FIGS. 5A-5B, there are shown the first semiconductor structure of FIG. 4A after performing an anneal to convert the polycrystalline microstructure (PM) of the first metallic layer 24A into a microstructure having columnar grains (CG), and the second semiconductor structure of FIG. 4B after performing an anneal to convert the polycrystalline microstructure (PM) of the second metallic layer 24B into a microstructure having columnar grains (CG). The first metallic layer having columnar grains, which may be referred to a microstructure modulated first metallic layer, is now labeled as element 24A'. The second metallic layer having columnar grains, which may be referred to a microstructure modulated second metallic layer, is now labeled as element 24B'. The term "columnar grains" is used throughout the present application to denote grains (i.e., bamboo microstructure) that run from a bottom surface of a material to a top surface of the same material. A continuous grain boundary across the top and bottom of the microstructure modulated first and second metallic layers (24A', 24B') can be provided by modulating the microstructure from polycrystalline to a columnar grain microstructure. In embodiments in which the one or more interconnect metallic structures (18A, 18B) have a polycrystalline microstructure, this anneal may also convert the polycrystalline microstructure of the one or more interconnect metallic structures (18A, 18B) into a columnar grain microstructure.

The anneal that modulates the microstructure of the metallic layers (24A, 24B) from polycrystalline to columnar may be performed at a temperature from 100° C. to 800° C. The anneal may be performed in nitrogen or a forming gas (i.e., a mixture of nitrogen and hydrogen). The anneal may be performed utilizing various anneal techniques including, but not limited to, a furnace anneal or a laser anneal. The duration of the anneal may vary. For example, and when a laser anneal is employed, the laser anneal can be performed for a duration from 20 nanoseconds to 5 minutes. When a furnace anneal is performed, the furnace anneal may be performed for a duration from 30 minutes to 2 hours.

Applicant has determined that by modulating the microstructure from polycrystalline to columnar grain, one can lower the electrical resistivity of the capacitor structure that is embedded in the 3D bonded semiconductor structure.

Figure 6A:
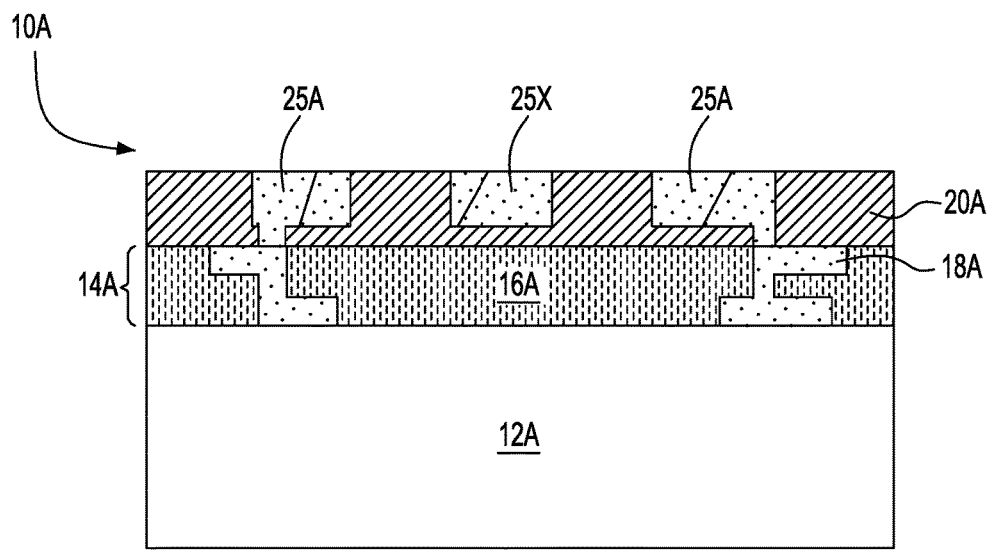
FIG. 6A is a cross sectional view of the first semiconductor structure of FIG. 5A after removing the first stress control layer from the surface of the first metallic layer containing columnar grains, and removing an upper portion of the first metallic layer containing columnar grains that is present outside the at least one first capacitor plate opening and the at least one first dummy pad opening.
Figure 6B:
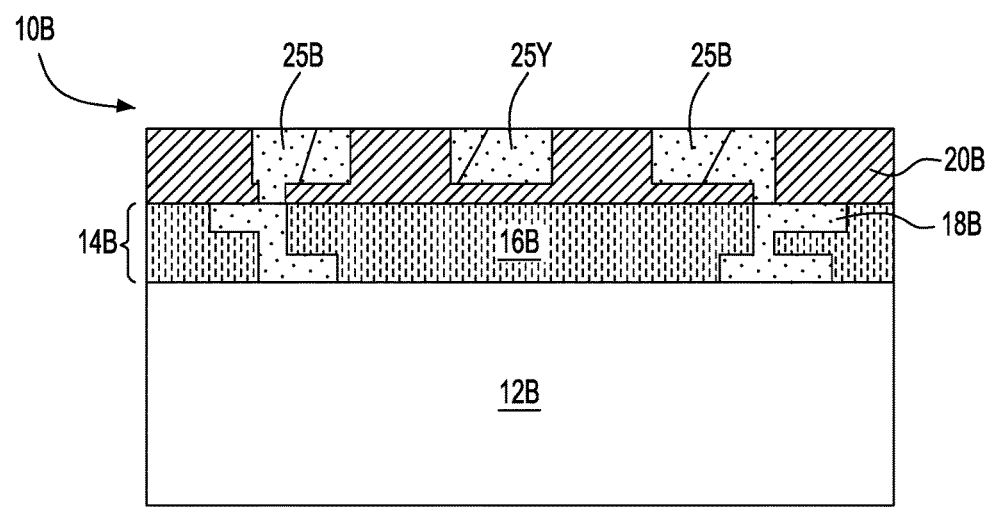
FIG. 6B is a cross sectional view of the second semiconductor structure of FIG. 5B after removing the second stress control layer from the surface of the second metallic layer containing columnar grains, and removing an upper portion of the second metallic layer containing columnar grains that is present outside the at least one second capacitor plate opening and the at least one second dummy pad opening.

Referring now to FIGS. 6A-6B, there are shown the first semiconductor structure of FIG. 5A after removing the first stress control layer 26A from the surface of the microstructure modulated first metallic layer 24A' containing columnar grains, and removing an upper portion of the microstructure modulated first metallic layer 24A' containing columnar grains that is present outside the at least one first capacitor plate opening 22A and the at least one first dummy pad opening 23A, and the second semiconductor structure of FIG. 5B after removing the second stress control layer 26B from the surface of the microstructure modulated second metallic layer 24B' containing columnar grains, and removing an upper portion of the microstructure modulated second metallic layer 24B' containing columnar grains that is present outside the at least one second capacitor plate opening 22B and the at least one second dummy pad opening 23B, respectively. The removal of the first and second stress control layers (26A, 26B) may be performed utilizing any material removal process that is capable of removing the metal or metal nitride that provides the first and second stress control layers (26A, 26B). In one embodiment, the material removal process may be a chemical etching process. In another embodiment, the material removal process may be a planarization process such as, for example, chemical mechanical polishing and/or grinding.

The material removal of the upper portion of the microstructure modulated first metallic layer 24A' and the upper portion of the upper portion of the microstructure modulated second metallic layer 24B' includes a planarization process such, as, for example, chemical mechanical polishing and/or grinding. In some embodiments, the removal of the stress control layers and an upper portion of the metallic layers may be performed in separate steps, or the various materials may be removed in a single step utilizing a single material removal process.

As shown in FIG. 6A, a portion of the microcrystalline modulated first metallic layer 24A' (having the columnar microstructure) remains in the at least one first capacitor plate opening 22A and the at least one first dummy pad opening 23A, while, and as shown in FIG. 6B, a portion of the microcrystalline modulated second metallic layer 24B' (having the columnar microstructure) remains in the at least one second capacitor plate opening 22B and the at least one second dummy pad opening 23B. The remaining first metallic layer 24A' that is present in the at least one first capacitor plate opening 22A is referred to as a first metallic capacitor plate structure 25A, while the first metallic layer 24A' that is present in the at least one first dummy pad opening 23A is referred to as a first dummy metallic pad structure 25X. Each first metallic capacitor plate structure 25A and each first dummy metallic pad structure 25X is composed of the same metal or metal alloy as the original first metallic layer 24A and they have a columnar grain microstructure. Each first metallic capacitor plate structure 25A and each first dummy metallic pad structure 25X has a topmost surface that is coplanar with a topmost surface of the first bonding oxide layer 20A. The remaining microcrystalline modulated second metallic layer 24B' that is present in the second capacitor plate opening 22A is referred to as a second metallic capacitor plate structure 25B, while the microcrystalline modulated second metallic layer 24B' that is present in the at least one second dummy pad opening 23B is referred to as a second metallic dummy metallic pad structure 25Y. Each second metallic capacitor plate structure 25B and each second dummy metallic pad structure 25Y is composed of the same metal or metal alloy as the original second metallic layer 24B and they have a columnar grain microstructure. Each second metallic capacitor plate structure 25B and each second dummy metallic pad structure 25Y has a topmost surface that is coplanar with a topmost surface of the second bonding oxide layer 20B.

At this point of the present application and prior to wafer to wafer alignment and subsequent bonding, the first and second exemplary semiconductor structures shown in FIGS. 6A and 6B may be subjected to a pre-bake step; pre-baking removes gases and/or moisture from the exemplary semiconductor structures and readies them for subsequent bonding The pre-bake step is optional and need not be performed in all instances. When employed, the pre-bake step can be performed at a temperature from 100° C. to 700° C. for a duration from 30 minutes to 4 hours and in a $N_2$ ambient or $N_2/H_2$ (i.e., a combined nitrogen and hydrogen) ambient. In some embodiments, a pre-bake step may be performed on after forming the high-k dielectric material 28 on a surface of one of the metallic capacitor plate structures.

Figure 7:
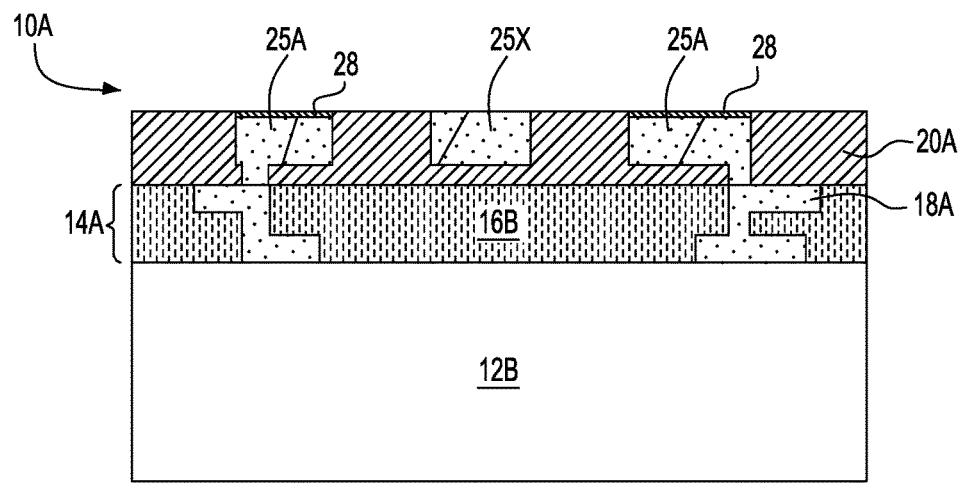
FIG. 7 is a cross sectional view of the first semiconductor structure of FIG. 6A after forming a high-k dielectric material on a recessed surface of the first metallic layer containing columnar grains that remains in the at least one first capacitor plate opening.

Referring now to FIG. 7, there is illustrated the first semiconductor structure of FIG. 6A after forming a high-k dielectric material 28 on a recessed surface of each first metallic capacitor plate structure 25A; the high-k dielectric material 28 is not formed on any portion of the first dummy metallic pad structure 25X. Although the present application describes and illustrates the forming of the high-k dielectric material 28 on a recessed surface of each first metallic capacitor plate structure 25A, the present application also contemplates an embodiment (not shown) in which the high-k dielectric material 28 is formed on a recessed surface of each second metallic capacitor plate structure 25B. In either embodiment, the high-k dielectric material 28 has a physically exposed surface that is coplanar with a physically exposed surface of the first bonding oxide layer 20A or the second bonding oxide layer 20B.

The term "high-k dielectric material" is used in the present application to denote a dielectric material having a dielectric constant that is greater than the dielectric constant of silicon dioxide; the dielectric constant of silicon dioxide is typically about 3.9. The dielectric material that can be used to provide the high-k dielectric material 28 may include, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The high-k dielectric material 28 can be formed by any deposition technique including, for example, chemical vapor deposition (CVD), plasma enhanced chemical vapor deposition (PECVD), physical vapor deposition (PVD), sputtering, or atomic layer deposition. In the present application, and prior to forming the high-k dielectric material 28, a block mask (not shown) containing openings is formed covering the topmost surface of the first bonding oxide layer 20A and the first dummy metallic pad structure 25X, while leaving each first metallic capacitor plate structure 25A physically exposed. A recess etch is then performed to lowering the height of each first metallic capacitor plate structure 25A; the recess etch may be omitted in embodiments in which each first metallic capacitor plate structure 25A is formed only partially within the at least one first capacitor plate opening 22A. The dielectric material that provides the high-k dielectric material 28 is then formed, and thereafter, the block mask is removed from the first semiconductor structure.

In some embodiments, it is possible to recess each second metallic capacitor plate structure 25B, but not each first metallic capacitor plate structure 25A. In such an embodiment, the high-k dielectric material 28 is formed on a non-recessed surface of each first metallic capacitor plate structure 25A.

Figure 8:
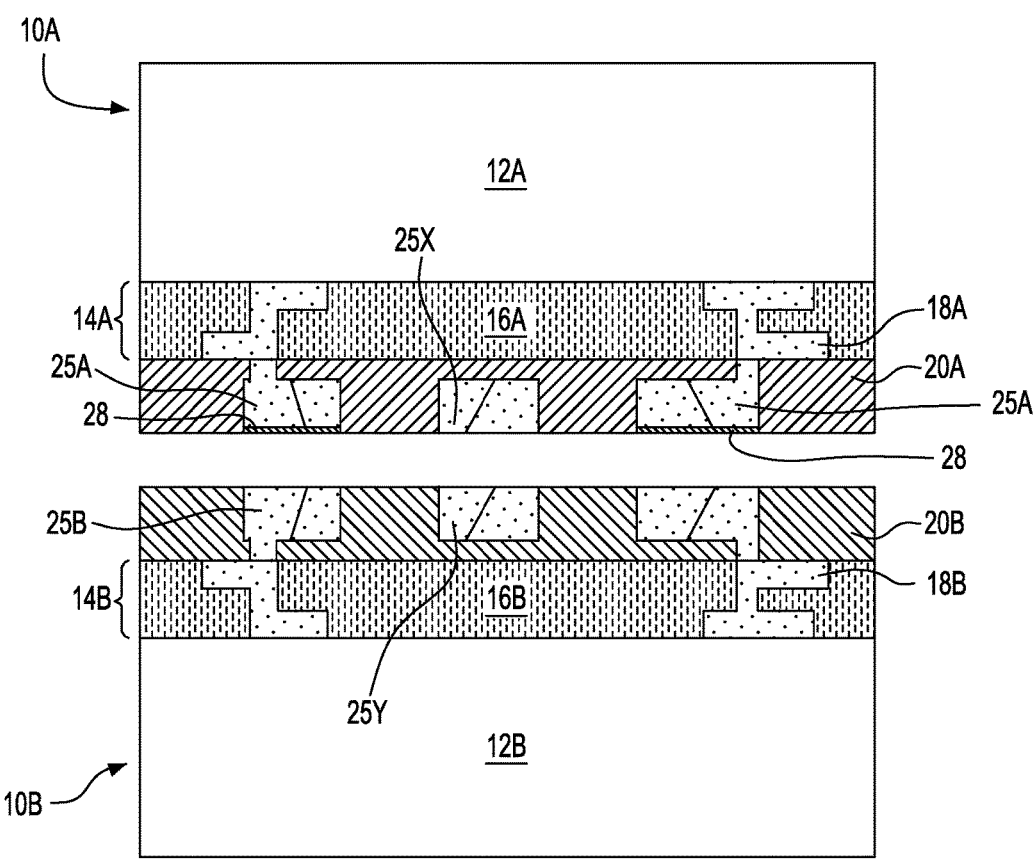
FIG. 8 is a sectional view of the first and second exemplary structures of FIGS. 7 and 6B after performing a wafer to wafer alignment process.

Referring now to FIG. 8, there is illustrated the first and second exemplary semiconductor structures of FIGS. 7 and 6B after performing a wafer to wafer alignment process. The wafer to wafer alignment process includes flipping one of the exemplary semiconductor structures upside down and placing the flipped semiconductor structure over the unflipped semiconductor structure such that the first metallic capacitor plate structures 25A containing the columnar microstructure and the high-k dielectric material 28 are aligned with the second metallic capacitor plate structure 25B containing the columnar microstructure. The wafer to wafer aligned may be performed by hand or by utilizing a robot arm.

Figure 9:
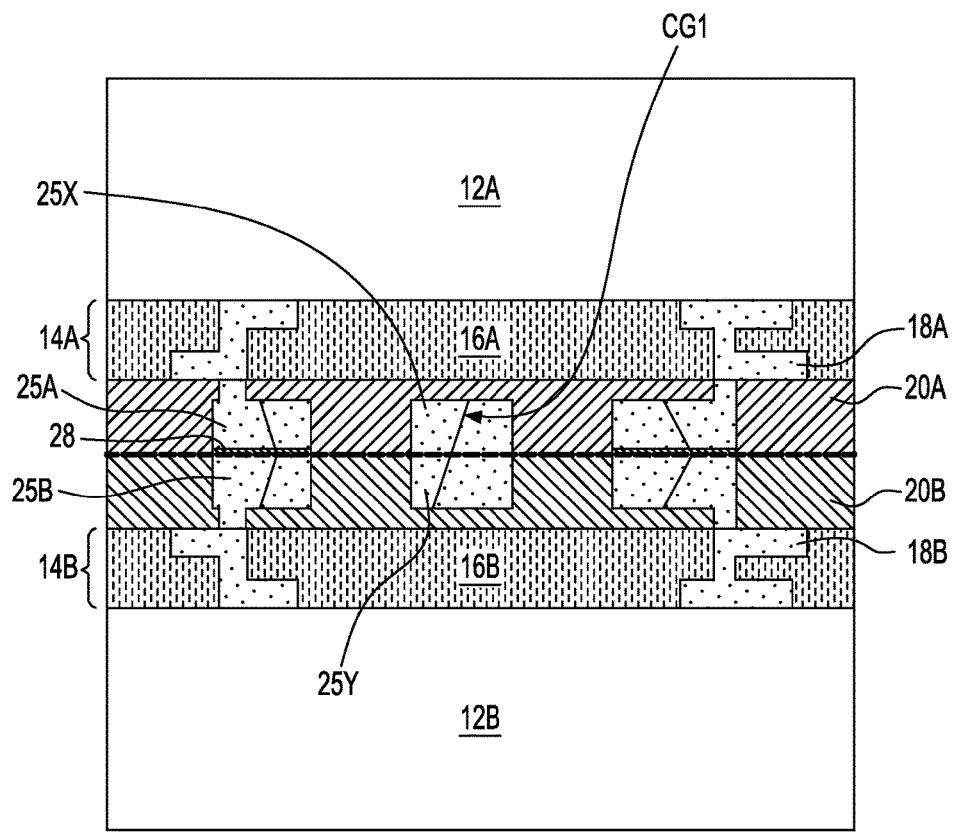
FIG. 9 is a cross sectional view of the first and second semiconductor structures of FIG. 8 after wafer bonding, wherein during bonding columnar grain growth is initiated such that at least one columnar grain extends across the bonding interface that is present between first and second dummy metallic pad structures.

Referring now to FIG. 9, there is illustrated the first and second semiconductor structures of FIG. 8 after wafer bonding, wherein during the wafer bonding columnar grain growth is initiated such that at least one columnar grain (CG1) extends across the bonding interface that is present between each of the first and second dummy metallic pad structures (25X, 25Y). Wafer bonding includes bringing the two exemplary semiconductor structures shown in FIG. 8 in intimate contact with each other, with or without application of an external force, and thereafter performing a bonding anneal that permanently bonds the two structures to each other. The bonding anneal may be performed at a temperature from 100° C. to 700° C. and in an ambient including nitrogen, hydrogen, helium or any mixtures thereof (i.e., nitrogen/helium or nitrogen/hydrogen or helium/hydrogen). Other bonding temperatures can be used as long as the other bonding temperatures cause bonding and initiate the grain growth mentioned above.

FIG. 9 illustrates a three-dimensional bonded semiconductor structure of the present application. The three-dimensional bonded semiconductor structure of FIG. 9 includes a first semiconductor structure 10A including a first semiconductor wafer 12A, a first interconnect structure 14A, a first bonding oxide layer 20A, and a first metallic capacitor plate structure 25A having a columnar grain microstructure embedded in the first bonding oxide layer 20A. The 3D bonded semiconductor structure of FIG. 9 also includes a second semiconductor structure 10B including a second semiconductor wafer 12B, a second interconnect structure 16B, a second bonding oxide layer 20B, and a second metallic capacitor plate structure 25B having a columnar grain microstructure embedded in the second bonding oxide layer 20. In accordance with the present application, a high-k dielectric material 28 is present between the first metallic capacitor plate structure 25A and the second metallic capacitor plate structure 25B. A bonding interface is present between the first and second bonding oxide layers (20A, 20B) and another bonding interface is present between the high-k dielectric material 28 and the first metallic capacitor plate structure 25A or the second metallic capacitor plate structure 25B. By "bonding interface" it is meant that the contacting surfaces of two materials are joined together by a chemical bond(s). In the drawing, the dotted line is show to represent a bonding interface that is presented in the 3D bonded semiconductor structure of the present application. As is shown, the high-k dielectric material 28 has outermost edges that are vertically aligned to the outermost edges of the first and second metallic capacitor plate structures (25A, 25B). In some embodiments and as shown, a bonding interface is also formed between each first and second dummy metallic pad structures (25X, 25Y). In such an embodiment, the first and second dummy metallic pad structures (25X, 25Y) also have a columnar grain microstructure, and at least one columnar grain, CG1, extends across the bonding interface that is present between the first and second dummy metallic pad structures (25X, 25Y). The presence of such dummy pad metallic pad structures having the columnar grain microstructure and the at least columnar grain that extends across the bonding interface can improve the mechanical bonding strength of the resultant structure. As is shown, the various bonding interfaces are along a same horizontal plane.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A three-dimensional (3D) bonded semiconductor structure comprising:
    a first semiconductor structure comprising a first semiconductor wafer, a first interconnect structure, a first bonding oxide layer, and a first metallic capacitor plate structure having a columnar grain microstructure embedded in the first bonding oxide layer; and
    a second semiconductor structure comprising a second semiconductor wafer, a second interconnect structure, a second bonding oxide layer, and a second metallic capacitor plate structure having a columnar grain microstructure embedded in the second bonding oxide layer, wherein a high-k dielectric material is present between the first metallic capacitor plate structure and the second metallic capacitor plate structure, and wherein a bonding interface is present between the first and second bonding oxide layers and another bonding interface is present between the high-k dielectric material and the first metallic capacitor plate structure or the second metallic capacitor plate structure.

2. The 3D bonded semiconductor structure of claim 1, further comprising a first dummy metallic pad structure embedded in the first bonding oxide layer and a second dummy metallic pad structure embedded in the second bonding oxide layer, wherein a yet other bonding interface is present between the first dummy metallic pad structure and the second dummy metallic pad structure.

3. The 3D bonded semiconductor structure of claim 2, wherein the first and second dummy metallic pad structures have a columnar grain microstructure, and wherein at least one columnar grain extends across the yet other bonding interface.

4. The 3D bonded semiconductor structure of claim 3, wherein the first and second metallic capacitor plate structures and the first and second dummy metallic pad structures are composed of a same metal or metal alloy.

5. The 3D bonded semiconductor structure of claim 4, wherein the metal or metal alloy comprises tantalum, tungsten, cobalt, rhodium, ruthenium, aluminum, copper or alloys thereof.

6. The 3D bonded semiconductor structure of claim 1, wherein the high-k dielectric material comprises $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_X$, a silicate thereof, or an alloy thereof, wherein each value of x is independently from 0.5 to 3 and each value of y is independently from 0 to 2.

7. The 3D bonded semiconductor structure of claim 1, wherein each of the first and second interconnect structures comprises at least one interconnect dielectric material and one or more interconnect metallic structures embedded therein.

8. The 3D bonded semiconductor structure of claim 7, wherein the at least one or more interconnect metallic structures are composed of copper, a copper-aluminum alloy, a copper manganese alloy, aluminum or an aluminum-copper alloy.

9. The 3D bonded semiconductor structure of claim 1, wherein the high-k dielectric material is present on a recessed surface of the first metallic plate capacitor structure or the second metallic plate capacitor structure.

10. The 3D bonded semiconductor structure of claim 1, wherein the high-k dielectric material has outermost edges that are vertically aligned to the outermost edges of the first and second metallic capacitor plate structures.

11. A method of forming a three-dimensional (3D) bonded semiconductor structure, the method comprising:
    providing a first semiconductor structure comprising a first semiconductor wafer, a first interconnect structure, a first bonding oxide layer, and a first metallic capacitor plate structure having a columnar grain microstructure embedded in the first bonding oxide layer, and a second semiconductor structure comprising a second semiconductor wafer, a second interconnect structure, a second bonding oxide layer, and a second metallic capacitor plate structure having a columnar grain microstructure embedded in the second bonding oxide layer;

forming a high-k dielectric material on a surface of the first metallic capacitor plate structure or the second metallic capacitor plate structure; and bonding the first semiconductor structure to the second semiconductor structure, wherein the bonding provides a bonding interface between the first and second bonding oxide layers and another bonding interface between the high-k dielectric material and the first metallic capacitor plate structure or the second metallic capacitor plate structure.

12. The method of claim 11, further comprising a first dummy metallic pad structure embedded in the first bonding oxide layer, and a second dummy metallic pad structure embedded in the second bonding oxide layer, wherein the bonding provides a yet other bonding interface between the first dummy metallic pad structure and the second dummy metallic pad structure.

13. The method of claim 12, wherein the first and second dummy metallic pad structures have a columnar grain microstructure, and wherein grain growth is initiated during the bonding such that at least one columnar grain extends across the yet other bonding interface.

14. The method of claim 13, wherein the first and second metallic capacitor plate structures and the first and second dummy metallic pad structures are composed of a same metal or metal alloy.

15. The method of claim 14, wherein the metal or metal alloy comprises tantalum, tungsten, cobalt, rhodium, ruthenium, aluminum, copper or alloys thereof.

16. The method of claim 11, wherein said at least one first metallic capacitor plate structure is formed by:

providing a first capacitor plate opening in the first bonding oxide layer;

forming a first metallic layer having a polycrystalline microstructure within the first capacitor plate opening and atop the first bonding oxide layer;

forming a first stress control layer on the first metallic layer;

performing an anneal to convert the polycrystalline microstructure of the first metallic layer into the columnar grain microstructure; and performing a material removal process, and said at least one second metallic capacitor plate structure is formed by:

providing a second capacitor plate opening in the second bonding oxide layer;

forming a second metallic layer having a polycrystalline microstructure within the second capacitor plate opening and atop the second bonding oxide layer;

forming a second stress control layer on the second metallic layer;

performing an anneal to convert the polycrystalline microstructure of the second metallic layer into the columnar grain microstructure; and performing a material removal process.

17. The method of claim 16, wherein each of the first and second stress control layers is composed of tantalum, tantalum nitride, titanium, titanium nitride, cobalt, cobalt nitride, tungsten, tungsten nitride, ruthenium, ruthenium nitride, aluminum or aluminum nitride.

18. The method of claim 16, wherein the annealing that converts said polycrystalline microstructure to the columnar grain microstructure is performed at a temperature from 100° C. to 800° C.

19. The method of claim 11, wherein the bonding comprises:

performing wafer to wafer alignment;

bringing the first semiconductor structure into intimate contact with the second semiconductor structure; and annealing at a temperature from 100° C. to 700° C. and in ambient including at least one of nitrogen, hydrogen, and helium.

20. The method of claim 11, wherein the forming the high-k dielectric material comprises recessing the first or second metallic capacitor plate structure prior to bonding.

* * * * *